United States Patent
Kimura

(10) Patent No.: US 6,984,889 B2
(45) Date of Patent: Jan. 10, 2006

(54) SEMICONDUCTOR DEVICE

(75) Inventor: Naoto Kimura, Kumamoto (JP)

(73) Assignee: NEC Electronics Corporation, Kawasaki (JP)

(*) Notice: Subject to any disclaimer, the term of this patent is extended or adjusted under 35 U.S.C. 154(b) by 0 days.

(21) Appl. No.: 10/827,067

(22) Filed: Apr. 19, 2004

(65) Prior Publication Data

US 2004/0195682 A1    Oct. 7, 2004

Related U.S. Application Data

(63) Continuation of application No. 10/151,416, filed on May 20, 2002, now Pat. No. 6,734,553.

(30) Foreign Application Priority Data

May 25, 2001    (JP)    ............................ 2001-156540

(51) Int. Cl.
    *H01L 23/34*    (2006.01)
(52) U.S. Cl. ..................... 257/723; 257/724; 257/784; 257/686; 257/777
(58) Field of Classification Search ........ 257/723–724, 257/784, 686, 777
    See application file for complete search history.

(56) References Cited

U.S. PATENT DOCUMENTS 5,717,245 A    2/1998    Pedder 6,239,366 B1    5/2001    Hsuan et al.
6,407,456 B1 *    6/2002    Ball ........................... 257/777
6,476,502 B2 *    11/2002    Yamada et al. ............. 257/778

FOREIGN PATENT DOCUMENTS

| JP | 08-250262 | 9/1996 |
| JP | 8-250652 | 9/1996 |
| JP | 09-181256 | 7/1997 |
| JP | 2000-307053 | 11/2000 |
| KR | 1999-0051070 | 7/1999 |

OTHER PUBLICATIONS

Chinese Office Action , Apr. 9, 2004.
Korean Office Action dated May 31, 2004.

* cited by examiner

*Primary Examiner*—Luan Thai
(74) *Attorney, Agent, or Firm*—Katten Muchin Rosenman LLP

(57) ABSTRACT

The semiconductor device according to the present invention is equipped with a plurality of electronic circuits including at least one semiconductor integrated circuit chip, and a plurality of intermediate substrates interposed between the electronic components and a package and mounting the electronic components directly on its one major face, where each of the electronic component has on the one major face at least a plurality of first electrodes connected to the electronic components, a plurality of second electrodes for external connection, and internal connection electrodes for connecting between the electronic components including the connection between the first electrodes and the second electrodes that are mutually corresponding.

15 Claims, 8 Drawing Sheets

SEMICONDUCTOR DEVICE

CROSS-REFERENCE TO RELATED APPLICATION

This application is a Continuation Application of application Ser. No. 10/151,416, filed on May 20, 2002 now U.S. Pat. No. 6,734,553.

BACKGROUND OF THE INVENTION

1. Field of the Invention

The present invention relates to a semiconductor device, and more particularly to a multichip module (referred to as MCM hereinafter) semiconductor device formed by mounting, within the same package, a plurality of electronic components including semiconductor integrated circuit chips (referred to as IC chips hereinafter) into which desired functions are incorporated.

2. Description of the Prior Art

In order to achieve further downsizing, weight reduction, thin forming and high performance for various kinds of apparatus employing a semiconductor device, high density packaging of various kinds of electronic component including IC chips has been investigated. As one of powerful means for achieving the objective there have been proposed various kinds of MCM semiconductor devices having a plurality of IC chips in the same package.

For example, a thin MCM package realizing a multichip semiconductor device with excellent heat dissipation has been proposed in Japanese Patent Applications Laid Open, No. Hei 8-250652, and an MCM semiconductor device aiming at low cost by employing a package that can be used universally even for different kinds or layouts of the IC chips to be mounted is proposed in Japanese Patent Applications Laid Open, No. Hei 9-181256.

FIGS. 7A and 7B show schematic sectional views of examples of semiconductor devices using an MCM package disclosed in Japanese Patent Applications Laid Open, No. Hei 8-250652.

FIG. 7A shows a diagrammatic drawing of a first example of MCM package 710. A printed wiring (PW) board 711 having a large number of level sections consists of a lower level section 712, an intermediate level section 713 and an upper level section 714. In this example, the lower level section 712 is continuous, whereas the intermediate and upper level sections respectively have through openings by means of which stepwise openings 715 are formed, and the stepwise openings form a cavity section 716 together with the lower level section 712.

An MCM tile is a silicon-on-silicon MCM tile 717 consisting of a silicon substrate 718 and silicon chips 719 and 720, and is situated in the cavity. The silicon substrate has a form in which it is placed in the cavity section on the surface of the lower level section of the PW board. Each of wire bond fingers 721 is interconnected to a contact pad 723 on the intermediate level section of the PW board via a wire 722.

In turn, each of these pads is interconnected to a part of another level section of the PW board, for example, a contact 725 via a through hole 724, thereby is interconnected to a solder bump 726 on the bottom face of the lower level section, and is interconnected as needed to another chip or an electronic device such as that represented by a symbol 727 or 728 on the surface of the upper level section of the PW board. Here, the MCM tile placed on the surface of the lower level section is located completely within the cavity section 716, and the top faces of the chips are at heights lower than the top face of the upper level section of the PW board.

An encapsulation sealing material 729 having high adaptability such as silicone gel is filled in the cavity section 716. The encapsulation sealing material 729 encapsulates the interconnecting sections between the chips and the silicon substrate, and the wire bond fingers on the silicon substrate, as well as the interconnection sections between the contact pads on the PW board, and the wires interconnecting the wire bond fingers and the contact pads.

In addition, a structural member 730 which acts as a heat sink and encapsulates the cavity section is provided in the device 710. The end parts 731 of the structural member (heat sink) are situated on the upper level section of the PW board. Although the heat sink is located with a spacing from the chips of the MCM tile, it is situated close to the MCM tile to such a degree that it is sufficient to collect heat generated by the constituent elements of the MCM tile during the operation of the device. As an option, a heat conductive adaptive member 732 such as a heat conductive paste or a thermal grease may be given so as to make physical contact with the chips and the heat sink.

A second example of MCM package 770 is shown in FIG. 7B. This is an example of an MCM tile having a constitution in which it is interconnected to the PW board by solder reflow bonding. The MCM package has a PW board 771 formed of a single level section which has a through opening 772. The positional relation between the PW board 771 and an MCM tile 717 is such that chips 719 and 720 of the MCM tile are within the opening 772, while the end parts of a silicon substrate 718 of the MCM tile are positioned to overlap with the bottom face of the PW board 771 adjacent to the opening so as to have the silicon substrate 718 of the MCM tile to be on the outside of the opening.

Each of bond fingers 773 on the silicon substrate is connected electrically to a contact 774 on the PW board by solder reflow interconnection. A cup-shaped cover 775 makes contact with the bottom face of the silicon substrate 718 while the flanges 776 of the cover are attached to the bottom of the PW board 771 by means of an adhesive (not shown). In order to use the cup-shaped cover as a heat sink for the MCM tile, it is formed of a metal such as copper or a plastic having a high heat conductive property. In the case of a metallic cover, it has an advantage that it acts as a shielding body against electromagnetic radiation.

A cavity section 777 is formed by the wall sections of the opening 772 and the cup-shaped cover, an encapsulation sealing material with adaptability such as silicone gel is filled partially, and the sealing material 729 seals and protects the interconnection part between the MCM tile and bond fingers, and the contacts.

The conventional MCM semiconductor device has a configuration in which a plurality of IC chips are mounted on a silicon substrate being an intermediate substrate, and the silicon substrate is mounted on a PW board, as described, for example, in the semiconductor device disclosed in Japanese Patent Applications Laid Open, No. Hei 8-250652. Accordingly, the size of the silicon substrate becomes extremely large compared with the size of the IC chips, but no consideration on their size is given there. However, in the configuration in which a silicon substrate is adhered to the entire surface of the PW board, as in the example shown in FIG. 7A, for example, there occurs a problem that the silicon substrate tends to have cracks due to thermal stress when the size of the silicon substrate is increased. Moreover, wirings mutually connecting the IC chips are formed on the silicon substrate along with the wirings for external connection. For a size of the silicon substrate which exceeds, for example, 20 mm×20 mm, there arises a limit at present in the refinement of a connection wiring pattern because it is impossible to form a wiring pattern in one time of exposure treatment, bringing about also a problem that restricts the realization of higher density for the connection wirings.

Now, by forming an opening in a PW board for mounting an intermediate substrate to accommodate IC chips mounted on the intermediate substrate in the opening, and connects the intermediate substrate to the PW board using only the electrode section provided in the periphery of the intermediate substrate, as in the example in FIG. 7B and the semiconductor device disclosed in Japanese Patent Applications Laid Open, No. Hei 9-181256, the problem of cracks in the intermediate substrate due to thermal stress can be relaxed. However, since a large opening is provided in the central part of the PW board, there still arises another problem that the number of external connection electrodes of the semiconductor device is limited or that it is necessary to enlarge the size of the PW board in order to secure a prescribed number of electrodes.

BRIEF SUMMARY OF THE INVENTION

OBJECT OF THE INVENTION

It is the object of the present invention to provide an MCM semiconductor device using an intermediate substrate which allows the refinement of a connection wiring on the intermediate substrate and relaxes to a large extent the problem of occurrence of cracks in the intermediate substrate even if the size of an IC chip is enlarged and the number of IC chips to be mounted on the semiconductor device is increased.

SUMMARY OF THE INVENTION

The semiconductor device according to the present invention comprises a plurality of electronic components including at least one semiconductor integrated circuit chip, and a plurality of intermediate substrates interposed between the electronic components and a package, having electronic components directly mounted on one major face, in which each of the intermediate substrates is equipped with at least a plurality of first electrodes that are connected to the electronic component, a plurality of second electrodes for external connection, and internal connection wirings that mutually connect the electronic components including the connection between the mutually corresponding first electrodes and the second electrodes on one major face.

BRIEF DESCRIPTION OF THE DRAWINGS

The above-mentioned and other objects, features and advantages of this invention will become more apparent by reference to the following detailed description of the invention taken in conjunction with the accompanying drawings, wherein:

FIG. 1 shows diagrams for describing a first embodiment of the semiconductor device according to the present invention in which

FIG. 3 shows diagrams for describing a second embodiment of the invention in which

FIG. 5 shows diagrams for describing a third embodiment of the semiconductor device of the invention in which

DETAILED DESCRIPTION OF THE INVENTION

Figure 1A:
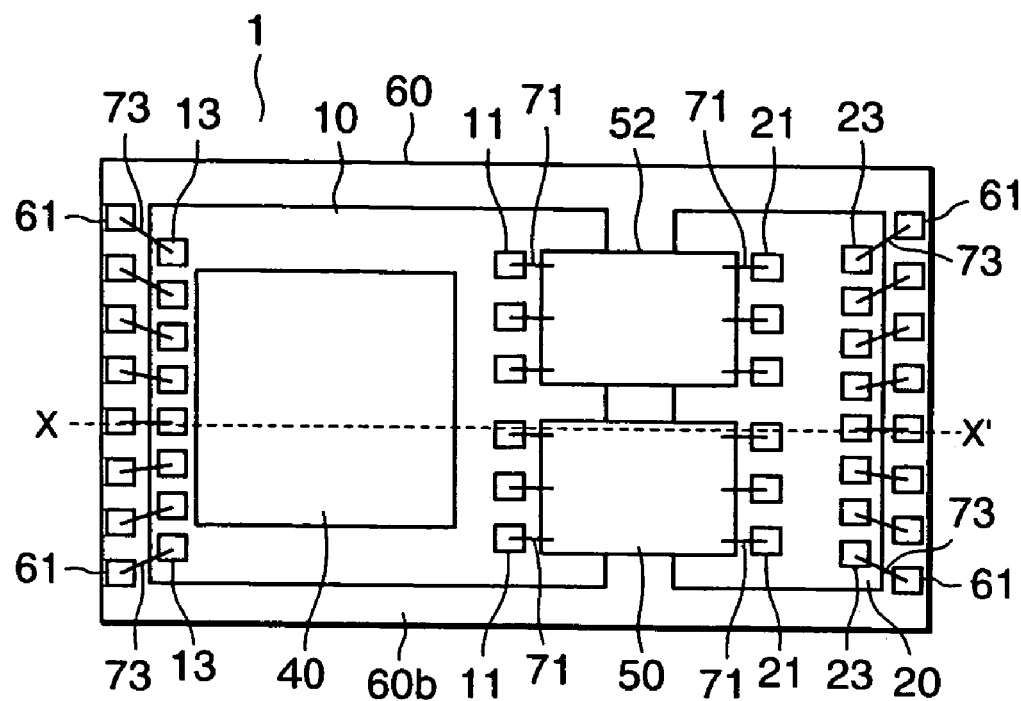
FIG. 1A is a schematic plan view.

Referring to the drawings, the present invention will be described in the following.

Figure 1B:
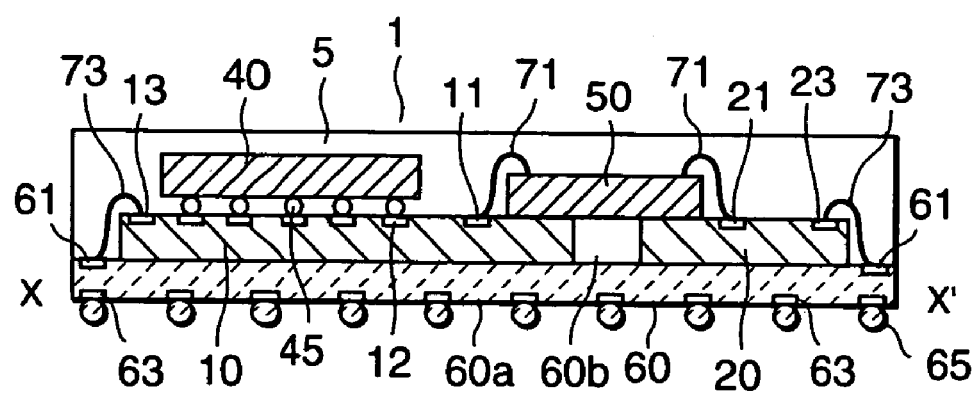
FIG. 1B is a schematic sectional view along line X–X' of FIG. 1A.

Referring to FIG. 1, semiconductor device 1 of this embodiment includes at least, for example, two intermediate substrates 10 and 20, three IC chips 40, 50 and 52 being electronic components, and a printed wiring board (referred to as PWB hereinafter).

First, description about principal configuration of each element is in order. The IC chip 40 has pad electrodes (not shown) for external connection on its surface side with elements formed on it, and solder bumps, for example, are formed on the electrodes. The IC chips 50 and 62 have bonding pads (not shown) serving as external connection electrodes on the surface side where elements are formed. Both of the intermediate substrates 10 and 20 are formed of silicon substrate with almost square or rectangular outer shape, and have a size, for example, of a square with a side of 20 mm or less that permits batch exposure by a general reduction projection aligner (the so-called stepper). The intermediate substrate 10 has bonding pads 11 and 13 on one major face and internal connection wirings that are not shown, and the intermediate substrate 20 has similarly bonding pads 21 and 23 and internal connection wirings that are not shown. Here, the bonding pads 11 and 21 are designated first electrodes, and the bonding pads 13 and 23 are designated second electrodes. The PWB 60 has external connection electrodes 63 on first face 60a, and internal connection electrodes 61 that will be designated third electrodes; on second face 60b that forms the reverse face with respect to the first face 60a which is the obverse face, and the mutually corresponding external connection electrodes 63 and the internal connection electrodes 61 are connected by wirings in the PWB (not shown). Besides, solder balls 65, for example, are formed on the external connection electrodes 63.

Next, the connection among these elements will be described. The IC chip 40 is connected face down to the intermediate substrate 10 by having the pad electrodes formed on the surface side of the chip 40 bonded by soldering, for example, via bumps 45, to the corresponding bump connection pads 12 formed on one major face of the substrate 10. The IC chips 50 and 52 are mounted at prescribed positions with their faces up straddling over the intermediate substrates 10 and 20, and respective bonding pads, not shown, and the corresponding bonding pads 11 and 21 that have been formed in advance on the substrates 10 and 20 are connected with metal wires 71 such as Au wires or Al wires. The intermediate substrates 10 and 20, with an adhesive on their back faces, are mounted at specified positions on the second face 60b of the PWB 60, and respective bonding pads 13 and 23 are connected to the corresponding internal connection electrodes 61 using metal wires 73. Furthermore, all the electronic components mounted on the second surface 60b of the PWB 60, and the electrodes formed on the second face 60b are sealed with a sealing resin 5 of epoxy type or the like.

Next, the manufacturing method of the semiconductor device 1 of this embodiment will be described briefly. FIG. 2 shows schematic sectional views of the principal processes for describing the manufacturing method. The IC chips 40, 50 and 52 may be manufactured by known methods, so their description will be omitted.

Figure 2A:
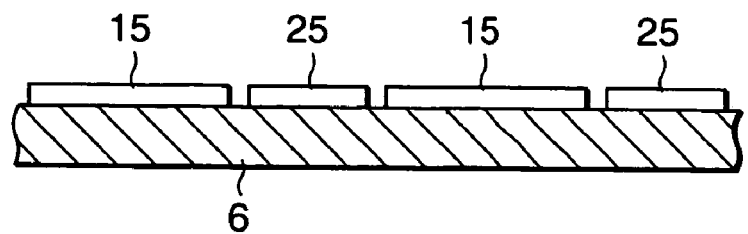
FIGS. 2A to 2C are schematic sectional views of principal processes for describing the manufacturing method of the semiconductor device of the first embodiment.
Figure 2B:
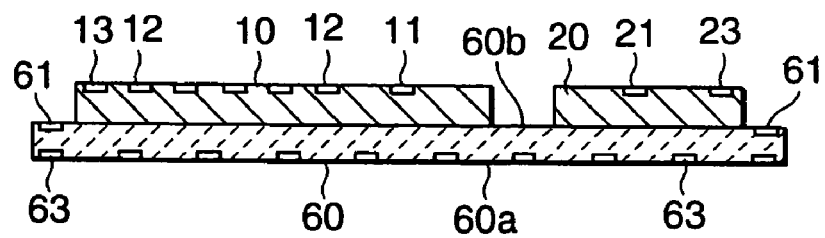
Figure 2C:
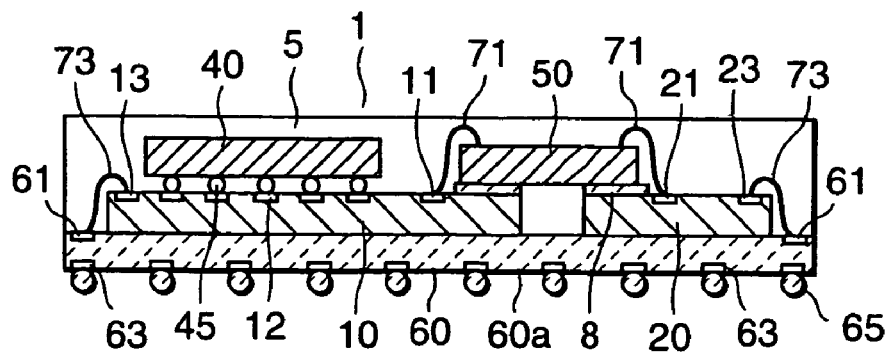
Figure 8:
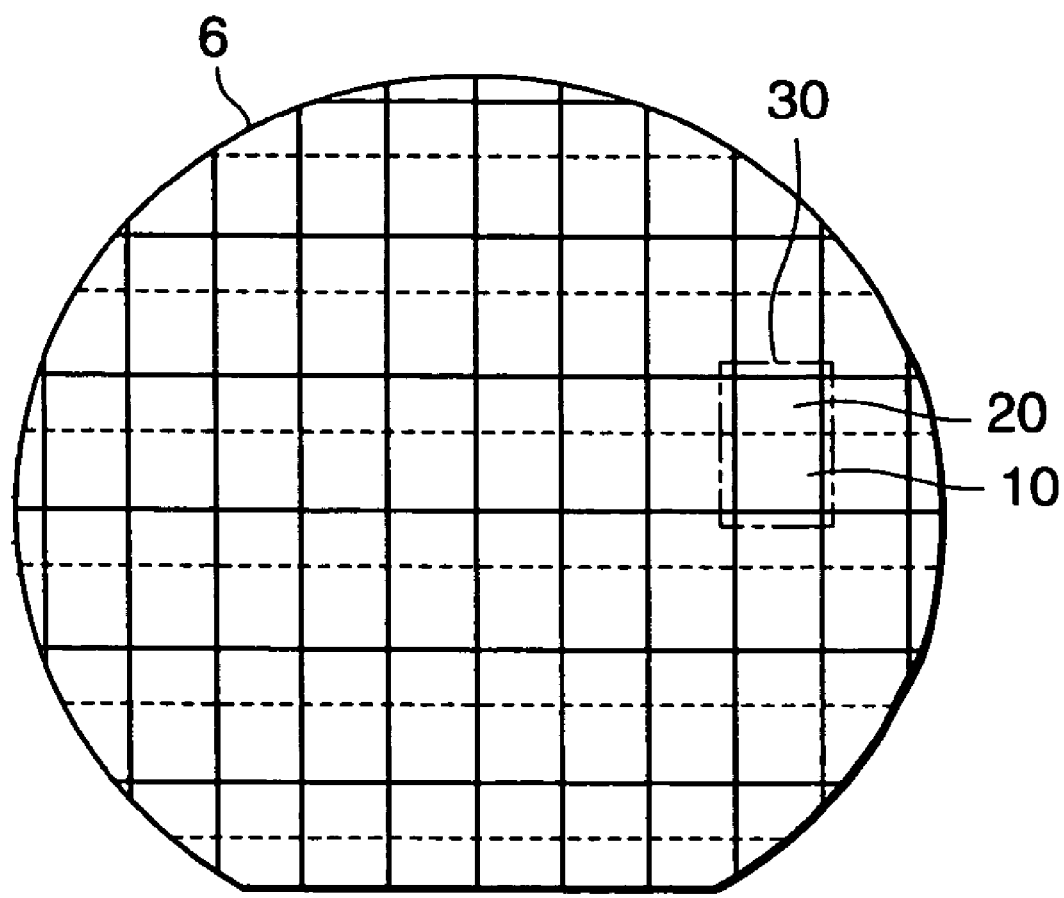
FIG. 8 is a schematic plan view for describing the manufacturing method of the intermediate substrates.

Referring to FIG. 2, first, an insulating film (not shown) is formed on the entire surface of a wafer 6, and on top of it, a desired connection wirings 15 including the bonding pads 11 and 13 and bump connection pads 12 corresponding to the intermediate substrate 10, and desired connection wirings including bonding pads 21 and 23 corresponding to the intermediate substrate 20 are formed, and the entire surface excluding portions that become later connection sections with other parts, namely, the bonding-pads 11, 13, 21, and 23 and the bump connection pads, and the like, are covered with an insulating film (not shown) (FIG. 2A). Here, the connection wirings 15 and 25 include wirings that connect the bonding pads 11 and 21 and bump connection pads 12 to the bonding pads 13 and 23, and the connection wirings among the IC chips 40, 50 and 52. The connection wirings 15 and 25 can be formed in exactly the same way as the wirings for normal semiconductor chips using conductive metallic material such as aluminum (Al), copper (Cu) and the like. Moreover, the intermediate substrates 10 and 20 may be manufactured by, for example, arranging the combination of the substrates 10 and 20 as a unit block 30, in matrix form on a wafer 6 as shown in FIG. 8. Then, the wafer 6 is cut in pieces of the blocks 30, and each piece is cut separately into the intermediate substrate pieces of 10 and 20. Next, the intermediate substrates 10 and 20 are mounted on the second face 60b of a prescribed PWB 60 prepared in advance, by bonding the back faces of the substrates 10 and 20 to prescribed positions on the face 60b (FIG. 2B). Following that, the IC chip 40 is mounted at a prescribed position of the intermediate substrate 10. More specifically, the IC chip 40 is mounted face down on the intermediate substrate 10 by bonding via the bumps 45 the pad electrodes that are provided on the surface of the IC chip 40 to the bump connection pads 12 formed in advance on one major face of the intermediate substrate 10 corresponding to the pad electrodes. In this way, the IC chip 40 is connected to the intermediate substrate 10 simultaneously electrically as well as mechanically. Next, the IC chips 50 and 52 are mounted face up at prescribed positions so as to straddle over the intermediate substrates 10 and 20. The bonding between the IC chips 50 and 52 and the intermediate substrates 10 and 20 is accomplished using a soft adhesive 8. Next, the bonding pads of the IC chips 50 and 52 that are not shown and the corresponding bonding pads 11 and 21 prepared in advance on the intermediate substrates 10 and 20 are connected by metal wires 71. Next, after connecting the bonding pads 13 and 23 of the intermediate substrates 10 and 20 and the corresponding internal connection electrodes 61 of the PWB 60 by the metal wires 73, the entire second surface 60b together with the mounted components are sealed with a prescribed resin, for example, an epoxy resin 5. Then, the external connection electrodes 63 are bonded using, for example, solder balls 65, completing the semiconductor device 1.

In the above, the wafer 6 for manufacturing the intermediate substrates 10 and 20 need only be flat. For example, the wafer may be one with its electrical properties deviating from the standards such that it cannot be used for manufacturing a product to incorporate the elements. Therefore, the cost for manufacturing these substrates will not amount too much. Moreover, in the present embodiment, an example has been given in which the intermediate substrates 10 and 20 are manufactured simultaneously from the same wafer, but they may be manufactured respectively from separate wafers.

As described in the above, the semiconductor device 1 of this embodiment uses a plurality of intermediate substrates formed of silicon substrate, and the size of one of the intermediate substrate is made smaller than a square with a side of 20 mm which can be subjected to a batch exposure of reduction projection aligner that is normally used, so that wirings with fine line width down to about 0.2 $\mu$m can be formed with ease. Accordingly, effects can be gained in which the connection wirings of the intermediate substrates are made high density, as well as it enables the mounting of IC chips of such type as flip-chip at high density. Moreover, by mounting prescribed electronic components straddling over different intermediate substrates, transfer of signals across a plurality of intermediate substrates can be facilitated. Moreover, by making the size of the intermediate substrates to be less than a square with a side of 20 mm, there occurs hardly the problem of cracks in the intermediate substrates due to the difference in the coefficient of thermal expansion from that of the PWB. Moreover, by the use of silicon substrate as the intermediate substrates, the coefficient of thermal expansion of the intermediate substrates becomes equal to that of the IC chip, so that it becomes possible, even in the mounting of a flip-chip, to obtain a sufficient resistance to temperature cycle without injection of an underfill between the intermediate substrates and the IC chip, reducing the manufacturing cost. Furthermore, the PWB is only required to connect the mutually corresponding internal connection electrodes and the external connection electrodes, so that it brings about an effect of reduction in the manufacturing cost of the PWB.

Figure 3A:
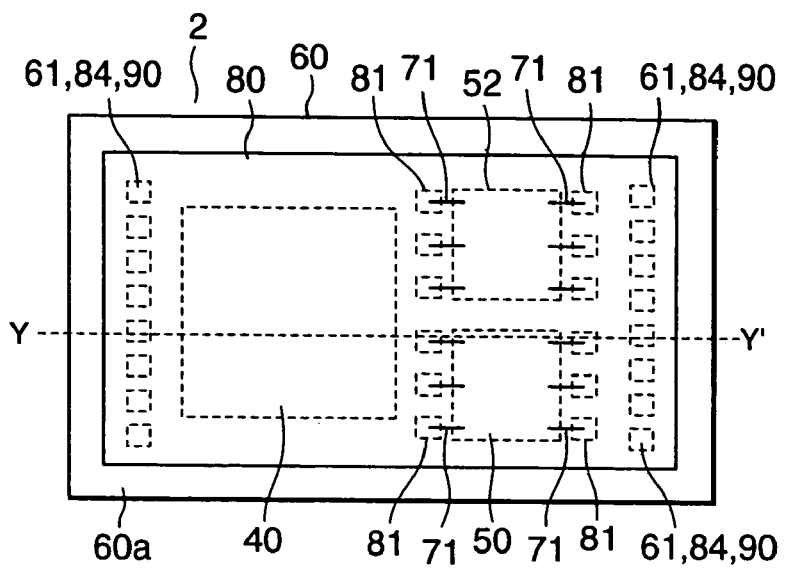
FIG. 3A is a schematic plan view and FIG. 3B and FIG. 3C are both schematic sectional views along line Y–Y' in FIG. 3A.
Figure 3B:
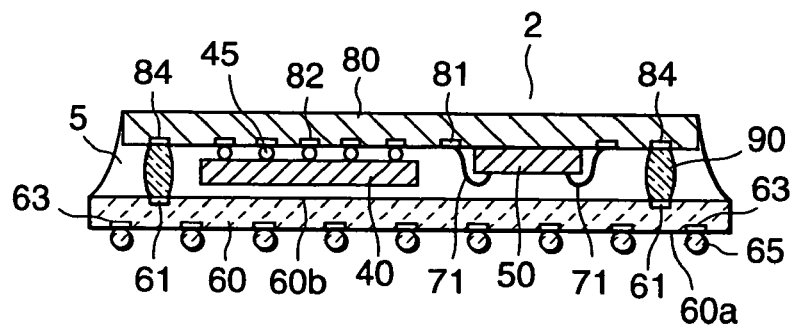

Next, referring to FIG. 3, semiconductor device 2 of a second embodiment of this invention will be described. With reference to FIGS. 3A and 3B, the semiconductor device 2 of this embodiment includes at least an intermediate substrate 80, three IC chips 40, 50 and 52, and a PWB 60. In the following, the same constituent elements as in the first embodiment are given the same reference symbols to omit the description.

The intermediate substrate 80 included in the semiconductor device 2 is formed of a silicon substrate with outer shape of almost a square or a rectangle. The intermediate substrate 80 is equipped on one major face with bonding pads 81, bump connection pads 82, intermediate connection pads 84 and internal connection wirings that are not shown. In this embodiment, the bonding pads 81 and the bump connection pads 82 are designated as first electrodes, and the intermediate connection pads 84 provided in the peripheral region are designated as second electrodes. The IC chip 40, with its pad electrodes provided on the surface connected with bump connection electrodes 82 formed on one major face of the intermediate substrate 80 corresponding to these pad electrodes, by soldering, for example, via bumps 45, is thus connected face-down to the intermediate substrate 80. Moreover, the IC chips 50 and 52 are mounted on specified positions of the intermediate substrate 80, and their respective bonding pads, not shown, are connected to the corresponding bonding pads 81 provided on the intermediate substrate 80 by means of metal wires 71.

Figure 4:
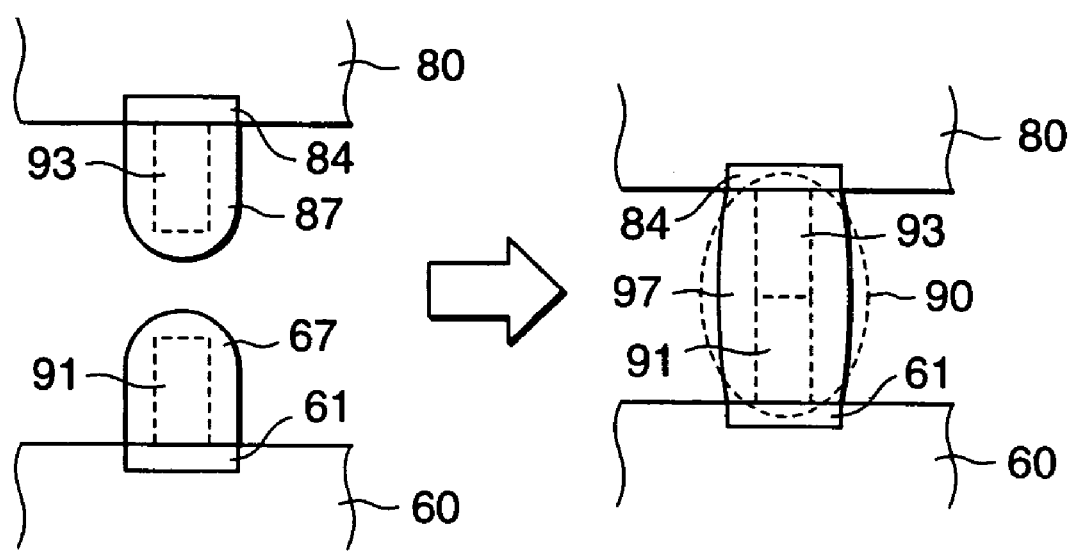
FIG. 4 is a schematic sectional view showing a specific example of a substrate connection bump of the second embodiment.

In this embodiment, one major face of the intermediate substrate 80 mounting all of the three electronic components 40, 50 and 52, and second face 60b of the PWB 60 are set facing with each other, and mutually corresponding intermediate connection pad 84 and internal connection electrode 61 are connected by bonding by a substrate connection-bump 90. In this case, the distance h1 between one major face of the intermediate substrate 80 and the second face 60b of the PWB 60 is set such that neither of the IC chips 40, 50 and 52 mounted on the intermediate substrate 80 and the metal wires 71 touches the second face 60b of the PWB 60. More specifically, t1 and t2 are set so as to satisfy the relation h1>(t1+t2), for example. As shown in FIG. 4, a bump having a minute pillar metal 91 with height t1 as the core and solder coating 67 on the surface is formed on each of the internal connection electrode 61 of the PWB, and a bump having minute metal pillar 93 with height t2 as the core and solder coating 87 on the surface is formed on each of the intermediate connection pad 84. Then, by placing the intermediate substrate 80 on a prescribed position of the PWB 60 and heating, the solders 67 and 87 are melted and become a solder 97 surrounding the periphery of the pillar metals 91 and 93 to form a substrate connection bump 90 positively securing prescribed height, enabling the mounting of the intermediate substrate 80 on the PWB 60. After mounting the intermediate substrate 80 on the PWB 60, resin 5 is injected into the space between the intermediate substrate 80 and the PWB 60.

Since the intermediate substrate 80 and the PWB 60 are bonded by means of the substrate connection bumps 90 alone in the semiconductor device 2 of this embodiment, even when the size of the intermediate substrate 80 is increased, it is possible to relax the occurrence of the cracks in the intermediate substrate 80 due to the difference in the coefficient of thermal expansion between the intermediate substrate 80 and the PWB 60. Moreover, when the size of the intermediate substrate 80 exceeds a square with a side of 20 mm, the density of connection wirings of this intermediate substrate 80 is somewhat lower than that of the intermediate substrate of the first embodiment, but it has a merit in that the bonding of the intermediate substrate and the PWB can be simplified.

Figure 3C:
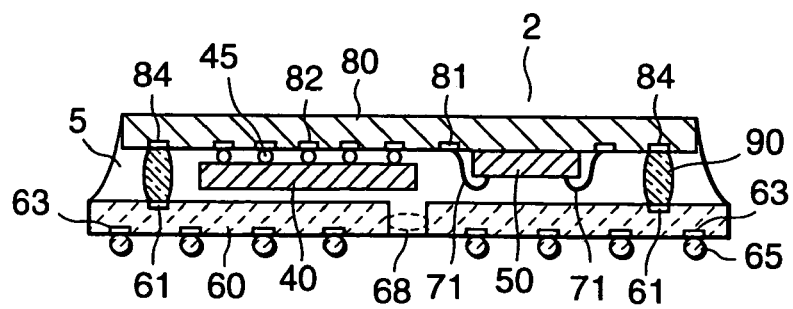

Furthermore, if required number of external connection electrodes 63 can be secured in this embodiment without providing the external connection electrodes in the central part of the PWB 60, it is possible to facilitate injection of resin 5 into the space between the intermediate substrate 80 and the PWB 60 by providing a through opening 68 of appropriate size at the central part of the PWB as shown in FIG. 3C.

Figure 5A:
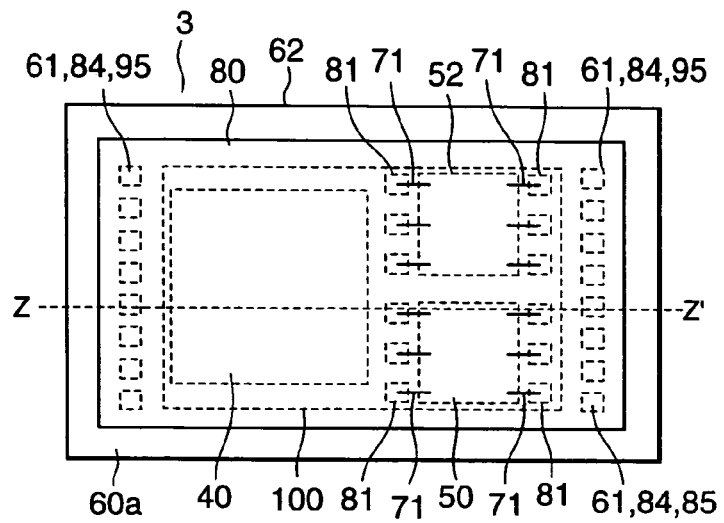
FIG. 5A is a schematic plan view.
Figure 5B:
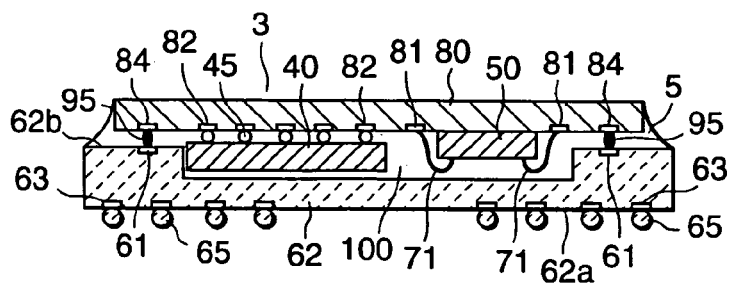
FIG. 5B and FIG. 5C are both schematic sectional views along line Z–Z' of FIG. 5A.

Next, a third embodiment of the semiconductor device according to this invention will be described. Referring to FIGS. 5A and 5B, of FIG. 5 describing a semiconductor device 3 of this embodiment, the device includes at least, for example, an intermediate substrate 80, three IC chips 40, 50 and 52, and a PWB 62. In what follows, constituent elements the same as those in the first and second embodiments are given the same reference symbols to omit the description.

Figure 5C:
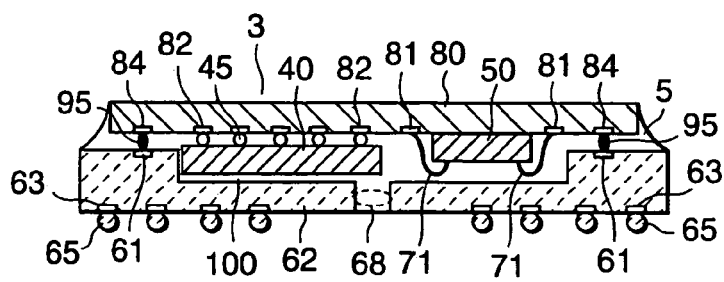
Figure 5D:
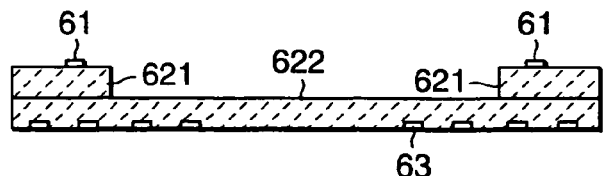
FIG. 5D is a sectional view showing a constitutional example of a PWB of this embodiment.

In the semiconductor device 3 of this embodiment, analogous to the second embodiment, one major face of the intermediate substrate 80 is placed facing the second face 62b of the PWB 62, and the corresponding intermediate connection pads 84 and the internal connection pads 61 are connected by bonding by means of bumps 95 of solder ball or the like. However, the PWB 62 included in the semiconductor device 3 of this embodiment differs significantly from the PWB 60 of the second embodiment in that a recess 100 is provided on the second face 62b side. The recess 100 does not include the regions where the internal connection electrodes 61 are formed, includes at least the regions facing the IC chips 40, 50 and 52 mounted on the intermediate substrate 80, and is formed such that part of the IC chips 40, 50 and 52 can be pushed in the recess 100. As a result, the height of the bumps 95 can be made lower than the substrate connection bumps 90 of the second embodiment, so that the semiconductor device can be made thinner than in the case of the second embodiment. Moreover, the recess 100 is not penetrating through the PWB 62, and since it is possible to provide external connection electrodes 63 on first face 62a side of the recess 100, there is no need for decreasing the number of external connection electrodes or increasing the size of the PWB 62 in order to secure desired number of these electrodes. The remaining configuration is similar to the case of the second embodiment so that the description about it will be omitted. In addition, it is similar to the second embodiment that injection of the resin 5 is facilitated by providing the through opening 68 at the central part of the PWB 62 as a modification of this embodiment, as shown in FIG. 5C. Moreover, the recess 100 of the PWB 62 can be formed easily by joining PWB 621 and PWB 622 with recess corresponding parts opened as shown in FIG. 5D.

As described in the above, in the first embodiment of this invention, a plurality of silicon substrates with size of less than a square with a side of 20 mm are used as the intermediate substrates for directly mounting a plurality of electronic components including IC chips in configuring an MCM semiconductor device. As a result, fine wirings with line width to about 0.2 μm can readily be formed on each intermediate substrate, and accordingly, high density wiring between electronic components and high density mounting of a large number of electronic components become possible. Moreover, even when an intermediate substrate is mounted on a PWB by bonding its back side to the PWB using an adhesive, similar to normal assembly of an IC chip, problem of cracks or the like due to the difference in the coefficient of thermal expansion between the PWB and the intermediate substrate will not occur because the size of the intermediate substrate is made smaller than a square with a side of 20 mm.

Moreover, in the second and third embodiments of this invention, one major face of the intermediate substrate on which all of a plurality of electronic components are mounted and the second face of the PWB placed facing with each other are connected by bonding with solder bumps or the like, and further a resin is injected in the space between the intermediate substrates and the PWB. Accordingly, the problem of cracks or the like due to the difference in the coefficient of thermal expansion between the intermediate substrate and the PWB can be relaxed even when the size of the intermediate substrate exceeds a square with a side of 22 mm. Moreover, in the third embodiment, a recess is provided in the second face of the PWB, so that it is possible to make the semiconductor device thin without affecting the number of external connection electrodes formed on the first face or the external size of the PWB.

Figure 6A:
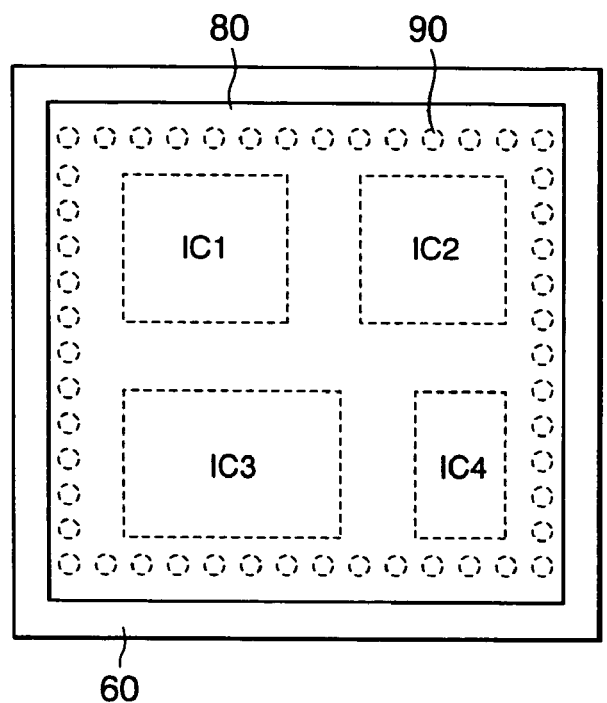
FIGS. 6A and 6B are schematic plan views for describing modifications to each of the embodiments of the semiconductor devices according to the invention.
Figure 6B:
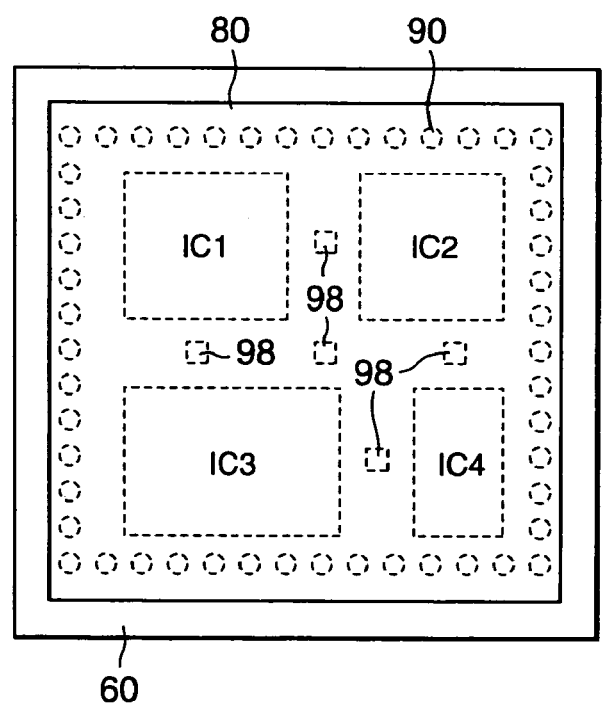
Figure 7A:
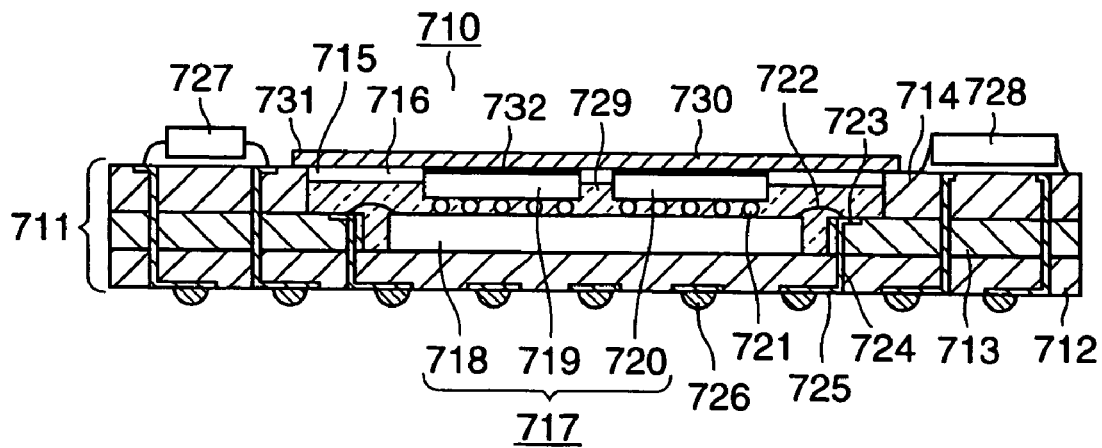
FIGS. 7A and 7B are schematic sectional views showing examples of the semiconductor device using conventional MCM packages.
Figure 7B:
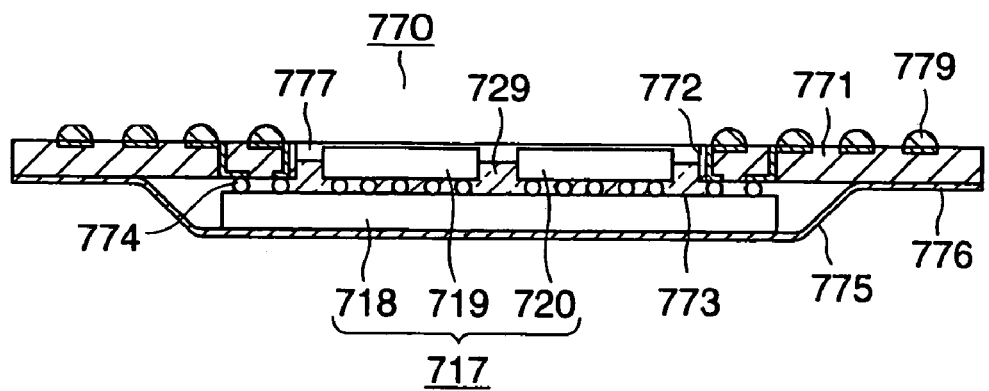

Furthermore, this invention is not limited to the description given in connection with the embodiments, and is modifiable in various ways within the scope of its concept. For example, the invention has been described with reference to the diagrams in which the internal connection electrodes of the PWB, being the third electrodes, and the bonding pads of the intermediate substrate (first embodiment) or the intermediate connection pads (second and third embodiments), being the second electrodes, are arranged in a single line on the respective side edge regions of two opposing sides. However, they may be arranged, as needed, on all of the four sides as in FIG. 6A, or may be arranged in a plurality of lines rather than in a single line, although not shown formally. Moreover, the invention has been described using examples in which the electronic components that are included in the semiconductor device are exclusively IC chips. However, the semiconductor may include other components such as resistors, capacitors and connection members, and furthermore, needless to say, the resistors and the capacitors can be incorporated on the intermediate substrate along with the connection wirings. Moreover, in the second embodiment, substrate connection bumps may be provided not only in the side edge regions but also in the internal regions as substrate connection internal bumps 98, as shown in FIG. 6B. In this way, it is also possible to partially simplify the wirings in the PWB that connect the third electrodes of the PWB and the external connection electrodes.

As described in the above, according to the present invention, it is possible to obtain the effect to realize easily and inexpensively an MCM semiconductor device that can mount at high density a large number of electronic components including IC chips irrespective of the difference in the coefficient of thermal expansion among the members that are used. In addition, the effect of making the MCM semiconductor device thin can also be obtained.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims cover any modifications or embodiments as fall within the true scope of the invention.

What is claimed is:

1. A semiconductor device comprising:
a board,
first and second intermediate substrates mounted on said board apart from each other, and
a first semiconductor chip having a first surface on which a plurality of first pads are formed and a second surface opposed to said first surface, said semiconductor chip being mounted over said first and second intermediate substrates in such a manner that a part of said second surface of said semiconductor chip faces said first intermediate substrate and another part of said second surface of said semiconductor chip faces said second intermediate substrate;
wherein said first intermediate substrate has a plurality of first bonding pads and said second intermediate substrate has a plurality of second bonding pads, each of said first bonding pads of said first intermediate substrate being electrically connected to an associated one of said first pads of said first semiconductor chip, and each of said second bonding pads being electrically connected to an associated one of said first pads of said first semiconductor chip.

2. The semiconductor device as claimed in claim 1, further comprising a second semiconductor chip having a third surface on which a plurality of second pads are formed and a fourth surface which opposes said third surface, said second semiconductor chip being mounted over said first and second intermediate substrates in such a manner that a part of said fourth surface faces said first intermediate substrate and another part of said fourth surface faces said second intermediate substrate.

3. The semiconductor device as claimed in claim 2, wherein each of said first and second intermediate substrates is formed in a rectangular shape and the length of either one side of the rectangular shape is less than 20 mm.

4. The semiconductor device as claimed in claim 2, wherein each of said first and second intermediate substrates is formed of a silicon substrate having electronic components formed therein, said electronic components including at least one of a capacitor and a resistor.

5. A semiconductor device comprising:
a board,
first and second intermediate substrates mounted on said board apart from each other, and
a first semiconductor chip having a first surface on which a plurality of first pads are formed and a second surface opposed to said first surface, said semiconductor chip being mounted over said first and second intermediate substrates in such a manner that a part of said second surface of said semiconductor chip faces said first intermediate substrate and another part of said second surface of said semiconductor chip faces said second intermediate substrate;
wherein said first intermediate substrate has a plurality of first bonding pads and said second intermediate substrate has a plurality of second bonding pads, each of said first bonding pads of said first intermediate substrate being connected via a first wire to an associated one of said first pads of said first semiconductor chip, and each of said second bonding pads being connected via a second wire to an associated one of said first pads of said first semiconductor chip.

6. The semiconductor device as claimed in claim 5, wherein said first intermediate substrate further has a plurality of third bonding pads each electrically connected to a corresponding one of said first bonding pads, and said second intermediate substrate further has a plurality of fourth bonding pads each electrically connected to a corresponding one of said second bonding pads, each of said third and fourth bonding pads being led out externally via a conductive line.

7. The semiconductor device as claimed in claim 6, wherein said conductive line is connected to said board to form an electrical path between said board and each of said third and fourth bonding pads.

8. The semiconductor device as claimed in claim 5, wherein each of said first and second intermediate substrates is formed in a rectangular shape, and either one side of the rectangular shape is less than 20 mm in length.

9. The semiconductor device as claimed in claim 5, wherein said first and second intermediate substrates are formed of a silicon substrate.

10. The semiconductor device as claimed in claim 9, wherein said silicon substrate includes electronic components formed therein.

11. A semiconductor device comprising:
a board
first and second intermediate substrates mounted on said board apart from each other, and a first semiconductor chip having a first surface on which a plurality of first pads are formed and a second surface opposed to said first surface, said semiconductor chip being mounted over said first and second intermediate substrates in such a manner that a part of said second surface of said semiconductor chip faces said first intermediate substrate and another part of said second surface of said semiconductor chip faces said second intermediate substrate;

wherein said first and second intermediate substrates include at least one of a capacitor and a resistor.

12. A semiconductor device comprising:

a board, first and second intermediate substrates mounted on said board apart from each other, and a first semiconductor chip having a first surface on which a plurality of first pads are formed and a second surface opposed to said first surface, said semiconductor chip being mounted over said first and second intermediate substrates in such a manner that a part of said second surface of said semiconductor chip faces said first intermediate substrate and another part of said second surface of said semiconductor chip faces said second intermediate substrate;

wherein said first intermediate substrate has a plurality of first bonding pads and a plurality of second bonding pads and said second intermediate substrate has a plurality of third bonding pads and a plurality of fourth bonding pads, each of said first bonding pads of said first intermediate substrate being connected via a first wire to an associated one of said first pads of said first semiconductor chip, each of said second bonding pads of said first intermediate substrate being connected via a second wire to an associated one of said second pads of said second semiconductor chip, each of said third bonding pads of said second intermediate substrate being connected via a third wire to an associated one of said first pads of said first semiconductor chip, and each of said fourth bonding pads of said second intermediate substrate being connected via a fourth wire to an associated one of said second pads of said second semiconductor chip.

13. The semiconductor device as claimed in claim 12, wherein said first intermediate substrate further has a plurality of fifth bonding pads each electrically connected to a corresponding one of said first and second bonding pads and said second intermediate substrate further has a plurality of sixth bonding pads each electrically connected to a corresponding one of third and fourth bonding pads, each of said fifth and sixth bonding pads being led out externally via a conductive line.

14. The semiconductor device as claimed in claim 13, wherein said conductive line is connected to said board to form an electrical path between said board and each of said first and second intermediate substrates.

15. A semiconductor device comprising:

a board;

first and second intermediate substrates mounted on said board apart from each other;

a first semiconductor chip having a first surface on which a plurality of first pads are formed and a second surface opposed to said first surface, said semiconductor chip being mounted over said first and second intermediate substrates in such a manner that a part of said second surface of said semiconductor chip faces said first intermediate substrate and another part of said second surface of said semiconductor chip faces said second intermediate substrate; and a second semiconductor chip having a third surface on which a plurality of second pads are formed and a fourth surface which opposes said third surface, said second semiconductor chip being mounted over said first and second intermediate substrates in such a manner that a part of said fourth surface faces said first intermediate substrate without intervention of said first semiconductor chip and another part of said fourth surface faces said second intermediate substrate without intervention of said first semiconductor chip.

* * * * *